US010269870B2

(12) United States Patent
Hu et al.

(10) Patent No.: US 10,269,870 B2
(45) Date of Patent: Apr. 23, 2019

(54) ORGANIC LIGHT-EMITTING DEVICE, PRODUCTION METHOD THEREOF, AND DISPLAY APPARATUS

(71) Applicants: BOE Technology Group Co., Ltd., Beining (CN); Hefei Xinsheng Optoelectronics Technology Co., Ltd., Hefei (CN)

(72) Inventors: Yue Hu, Beijing (CN); Lifang Song, Beijing (CN); Xinxin Wang, Beijing (CN); Kai Xu, Beijing (CN); Lei Huang, Beijing (CN); Zhijie Ye, Beijing (CN); Xiang Wan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/576,627

(22) PCT Filed: May 15, 2017

(86) PCT No.: PCT/CN2017/084295
§ 371 (c)(1),
(2) Date: Nov. 22, 2017

(87) PCT Pub. No.: WO2018/018999
PCT Pub. Date: Feb. 1, 2018

(65) Prior Publication Data
US 2018/0204887 A1 Jul. 19, 2018

(30) Foreign Application Priority Data

Jul. 27, 2016 (CN) .......................... 2016 1 0605390

(51) Int. Cl.
*H01L 51/50* (2006.01)
*H01L 27/32* (2006.01)
(Continued)

(52) U.S. Cl.
CPC ...... *H01L 27/3206* (2013.01); *H01L 51/5044* (2013.01); *H01L 51/5206* (2013.01);
(Continued)

(58) Field of Classification Search
None
See application file for complete search history.

(56) References Cited

U.S. PATENT DOCUMENTS 7,142,179 B2 * 11/2006 Miller .................. G09G 3/3233
345/76
7,400,090 B1 * 7/2008 Berger ................ H01L 51/5221
313/504
(Continued)

FOREIGN PATENT DOCUMENTS

CN 101237731 A 8/2008
CN 102709481 A 10/2012
(Continued)

OTHER PUBLICATIONS

English translation of International Search Report and Written Opinion (Chinese version was previously-submitted at the time of filing of the instant application) for International Application No. PCT/CN2017/084295, dated Jul. 27, 2017, 11 pages.

*Primary Examiner* — Michael Lebentritt
(74) *Attorney, Agent, or Firm* — Westman, Champlin & Koehler, P.A.

(57) ABSTRACT

This disclosure discloses an organic light-emitting device, a production method thereof, and a display apparatus, and belongs to the technical field of display. The organic light-emitting device comprises: a first electrode; a second elec-
(Continued)

trode; a first light-emitting layer provided between the first electrode and the second electrode; a spacing layer provided between the first light-emitting layer and the second electrode; and a light intensity compensation layer provided between the spacing layer and the second electrode, wherein the color of light emitted from the light intensity compensation layer is the same as that of the first light-emitting layer, and when a recombination area of electrons and holes in the first light-emitting layer moves, the light intensity compensation layer limits the recombination area in the light intensity compensation layer and compensates the light intensity of the first light-emitting layer.

19 Claims, 4 Drawing Sheets

(51) Int. Cl.
*H01L 51/56* (2006.01)
*H01L 51/52* (2006.01)

(52) U.S. Cl.
CPC .......... *H01L 51/5221* (2013.01); *H01L 51/56* (2013.01); *H01L 51/5004* (2013.01); *H01L 2227/32* (2013.01)

(56) References Cited

U.S. PATENT DOCUMENTS

| | | | | |
|---|---|---|---|---|
| 7,671,826 B2* | 3/2010 | Kimura | ................ | G09G 3/3233 345/76 |
| 7,728,512 B2* | 6/2010 | D'Andrade | ......... | H01L 51/5265 313/504 |
| 7,888,858 B2* | 2/2011 | Cok | .................... | H01L 27/3213 313/501 |
| 8,274,214 B2* | 9/2012 | Ikeda | ................. | H01L 51/5016 313/503 |
| 8,299,456 B2* | 10/2012 | Seo | ..................... | H01L 51/5016 257/40 |
| 9,196,856 B2 | 11/2015 | Qiu et al. | | |
| 9,477,086 B2* | 10/2016 | Choi | .................. | G02B 27/2214 |
| 9,502,477 B2* | 11/2016 | Lee | ...................... | H01L 27/322 |
| 9,620,737 B2* | 4/2017 | Lee | ...................... | H01L 51/5253 |
| 9,640,781 B2* | 5/2017 | Xiang | ................ | H01L 51/5203 |
| 9,859,519 B2* | 1/2018 | Kim | .................... | H01L 51/5044 |
| 9,971,166 B2* | 5/2018 | Lee | ..................... | G02B 27/2214 |
| 2005/0035353 A1* | 2/2005 | Adachi | .................. | H01L 27/12 257/72 |
| 2007/0013297 A1 | 1/2007 | Park | | |
| 2008/0036363 A1* | 2/2008 | Peng | .................. | H01L 27/3269 313/501 |
| 2013/0119357 A1* | 5/2013 | Kim | .................... | H01L 51/5048 257/40 |
| 2013/0161595 A1* | 6/2013 | Kim | .................... | H01L 27/3216 257/40 |
| 2013/0175512 A1* | 7/2013 | Kim | .................... | H01L 51/5004 257/40 |
| 2015/0008408 A1* | 1/2015 | Lee | ..................... | H01L 27/3244 257/40 |
| 2015/0188074 A1 | 7/2015 | Heo et al. | | |
| 2015/0228865 A1* | 8/2015 | Rhee | ..................... | H01L 27/156 257/90 |
| 2015/0348463 A1* | 12/2015 | Lee | ..................... | G09G 3/3233 345/690 |
| 2015/0348464 A1* | 12/2015 | In | ........................ | G09G 3/2022 345/205 |
| 2016/0043324 A1 | 2/2016 | Qiu et al. | | |
| 2016/0133175 A1* | 5/2016 | Lee | ..................... | G09G 3/3208 345/694 |
| 2016/0163258 A1* | 6/2016 | Cho | ..................... | G09G 3/3225 345/690 |
| 2016/0315285 A1* | 10/2016 | Heo | .................... | H01L 51/5203 |
| 2017/0365088 A1* | 12/2017 | Bell | .................... | G02F 1/13471 |
| 2017/0365216 A1* | 12/2017 | Yoon | .................... | G09G 3/3233 |

FOREIGN PATENT DOCUMENTS

| | | |
|---|---|---|
| CN | 104752625 A | 7/2015 |
| CN | 106024844 A | 10/2016 |

* cited by examiner

100

US 10,269,870 B2

ORGANIC LIGHT-EMITTING DEVICE, PRODUCTION METHOD THEREOF, AND DISPLAY APPARATUS

CROSS-REFERENCE TO RELATED APPLICATION

This application is a Section 371 National Stage Application of International Application No. PCT/CN2017/084295, filed May 15, 2017, which has not yet published, and claims priority benefits of Chinese Application No. 201610605390.4 filed on Jul. 27, 2016, the entire contents of which are hereby incorporated by reference.

FIELD OF THE INVENTION

This disclosure relates to the technical field of display, and particularly to an organic light-emitting device, a production method thereof, and a display apparatus.

BACKGROUND OF THE INVENTION

An organic light-emitting device, that is, an organic light-emitting diode (OLED) device, does not require any back light lamp, and has the property of self light emission. Organic light-emitting devices have been widely used in terminal products such as smartphones, tablet computers, televisions, and the like, due to characteristics such as high brightness, large view angle, low voltage, low energy consumption, fast response, good bendability, simple process, high light-emitting efficiency, wide temperature range, and the like.

At present, a prevalent demand relating to the technical field of organic light-emitting devices is to further increase the light-emitting performance of the organic light-emitting devices.

SUMMARY OF THE INVENTION

This disclosure provides an organic light-emitting device, a production method thereof, and a display apparatus. The technical solutions are as follows.

In a first aspect, there is provided an organic light-emitting device, comprising:

a first electrode;

a second electrode;

a first light-emitting layer provided between the first electrode and the second electrode;

a spacing layer provided between the first light-emitting layer and the second electrode; and a light intensity compensation layer provided between the spacing layer and the second electrode, wherein the color of light emitted from the light intensity compensation layer is the same as that of the first light-emitting layer, and when a recombination area of electrons and holes in the first light-emitting layer moves, the light intensity compensation layer limits the recombination area in the light intensity compensation layer and compensates the light intensity of the first light-emitting layer.

Optionally, the organic light-emitting device further comprises:

a charge generation layer provided between the light intensity compensation layer and the second electrode; and a second light-emitting layer provided between the charge generation layer and the second electrode.

Optionally, the organic light-emitting device further comprises:

a third light-emitting layer provided between the second light-emitting layer and the second electrode.

Optionally, the light intensity compensation layer comprises a host material and a guest dopant, the guest dopant is doped in the host material, the host material is an n-type organic semiconductor material, and the guest dopant is a light-emitting material.

Optionally, the host material in the light intensity compensation layer is selected from one or more of aromatic compounds having a large conjugate plane such as N-arylbenzimidazoles; 1,2,4-triazole derivatives (TAZ); 1,3,4-oxadiazole derivatives OXD-(P-NMe$_2$); and distyrylarylenes; and the guest dopant in the light intensity compensation layer is mainly selected from metal complex light-emitting materials and the metal complex light-emitting material is formed by the coordination of a metal ion and a ligand, wherein $Be^{2+}$, $Zn^{2+}$, $Al^{3+}$, $Ca^{2+}$, $In^{3+}$, $Tb^{3+}$, $Eu^{3+}$, or $Gd^{3+}$ may be used as the metal ion and 8-hydroxyquinolines, 10-hydroxybenzoquinolines, Schiff bases, hydroxybenzothiazoles (oxazoles), and hydroxyflavonoids may be used as the ligand.

Optionally, the highest occupied molecular orbital (HOMO) energy level of the host material is lower than or equal to the HOMO energy level of the spacing layer, and the lowest unoccupied molecular orbital (LUMO) energy level of the host material is equal to the LUMO energy level of the spacing layer.

Optionally, the HOMO energy level difference between the host material and the spacing layer is 0.1 eV to 0.3 eV.

Optionally, the doping concentration of the guest dopant in the light intensity compensation layer is 1 wt % to 10 wt % based on the total weight of the light intensity compensation layer.

Optionally, the light intensity compensation layer has a thickness of 5 nm to 10 nm.

Optionally, the spacing layer is produced from an n-type organic semiconductor material, the highest occupied molecular orbital (HOMO) energy level of the spacing layer is lower than the HOMO energy level of the first light-emitting layer, and the lowest unoccupied molecular orbital (LUMO) energy level of the spacing layer is higher than the LUMO energy level of the first light-emitting layer.

Optionally, the HOMO energy level difference between the spacing layer and the first light-emitting layer is 0.1 eV to 0.5 eV; and the LUMO energy level difference between the spacing layer and the first light-emitting layer is 0.1 eV to 0.3 eV.

Optionally, the n-type organic semiconductor material from which the spacing layer is produced is selected from one or more of aromatic compounds having a large conjugate plane, aluminum 8-hydroxyquinolinate (Alq$_3$) metal complexes, oxadiazole compounds, imidazole compounds, perfluorated materials, and organoboron and organosilicon materials.

Optionally, the spacing layer has a thickness of 2 nm to 3 nm.

Optionally, the light intensity compensation layer and the first light-emitting layer are both blue light-emitting layers;

the second light-emitting layer is a red light-emitting layer; and the third light-emitting layer is a green light-emitting layer.

Optionally, the organic light-emitting device further comprises:

a first hole transport layer provided between the first electrode and the first light-emitting layer; and a first electron transport layer provided between the light intensity compensation layer and the second electrode.

In a second aspect, there is provided a production method of an organic light-emitting device, comprising the steps of:

forming a first light-emitting layer on a first electrode;

forming a spacing layer on the first light-emitting layer;

forming a light intensity compensation layer on the spacing layer; and forming a second electrode on the light intensity compensation layer;

wherein the color of light emitted from the light intensity compensation layer is the same as that of the first light-emitting layer, and when a recombination area of electrons and holes in the first light-emitting layer moves, the light intensity compensation layer limits the recombination area in the light intensity compensation layer and compensates the light intensity of the first light-emitting layer.

Optionally, said forming a second electrode on the light intensity compensation layer comprises:

forming a charge generation layer, a second light-emitting layer, and the second electrode, in this order, on the light intensity compensation layer.

Optionally, said forming a second electrode on the light intensity compensation layer comprises:

forming the charge generation layer, the second light-emitting layer, a third light-emitting layer, and the second electrode, in this order, on the light intensity compensation layer.

Optionally, the light intensity compensation layer and the first light-emitting layer are both blue light-emitting layers;

the second light-emitting layer is a red light-emitting layer; and the third light-emitting layer is a green light-emitting layer.

Optionally, said forming a first light-emitting layer on a first electrode comprises:

forming a first hole transport layer and the first light-emitting layer, in this order, on the first electrode; and said forming a second electrode on the light intensity compensation layer comprises:

forming a first electron transport layer and the second electrode, in this order, on the light intensity compensation layer.

In a third aspect, there is provided a display apparatus comprising the organic light-emitting device of the first aspect.

BRIEF DESCRIPTION OF THE DRAWINGS

In order to illustrate the technical solutions in embodiments of this disclosure more clearly, figures required for describing the embodiments will be simply introduced below. It is apparent that the figures described below are merely some embodiments of this disclosure, and other figures may be further obtained by those of ordinary skill in the art according to these figures without exerting inventive work.

FIG. 2-1 is a structural schematic diagram of an organic light-emitting device provided by an embodiment of this disclosure;

FIG. 2-2 is a structural schematic diagram of another organic light-emitting device provided by an embodiment of this disclosure;

FIG. 2-3 is a structural schematic diagram of yet another organic light-emitting device provided by an embodiment of this disclosure;

FIG. 3-1 is a flow chart of a production method of an organic light-emitting device provided by an embodiment of this disclosure;

FIG. 3-2 is a structural schematic diagram of forming a first light-emitting layer provided by an embodiment of this disclosure;

FIG. 3-3 is a structural schematic diagram of forming a spacing layer provided by an embodiment of this disclosure;

FIG. 3-4 is a structural schematic diagram of forming a light intensity compensation layer provided by an embodiment of this disclosure; and FIG. 3-5 is a structural schematic diagram of still another organic light-emitting device provided by an embodiment of this disclosure.

Specific embodiments of this disclosure have been illustrated by the accompanying drawings described above, and more detailed descriptions will be provided hereinafter. These accompanying drawings and literal descriptions are not for the purpose of limiting the scope of the concept of this disclosure, but illustrate the conception of this disclosure for the person skilled in the art with reference to particular embodiments.

DETAILED DESCRIPTION OF THE INVENTION

In order to enable the objects, technical solutions, and advantages of this disclosure to be clearer, embodiments of this disclosure will be further described in details in conjunction with accompanying drawings.

Figure 1:
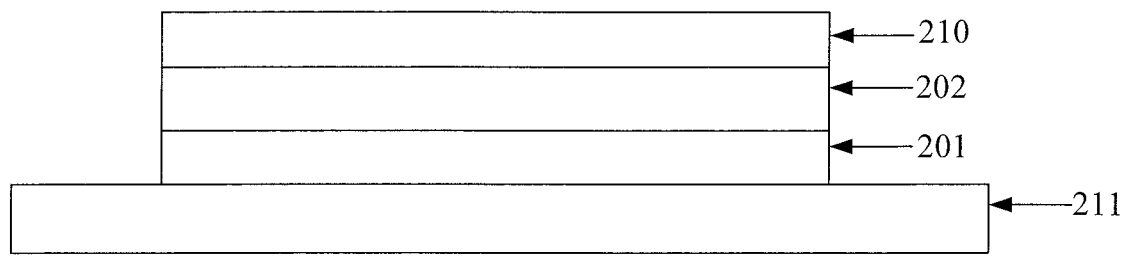
FIG. 1 is a structural schematic diagram of an organic light-emitting device.

As shown in FIG. 1, an organic light-emitting device comprises a substrate 211, and a transparent anode 201, a light-emitting layer 202, and a cathode 210 are formed, in this order, on the substrate 211. The principle of light emission of this organic light-emitting device is as follows. Voltage is applied between the transparent anode and the cathode, holes and electrons move to the light-emitting layer under the action of this voltage, the holes and the electrons are combined in the light-emitting layer to form excitons, and the excitons are recombined in the light-emitting layer to emit light.

However, in the organic light-emitting device described above, the light intensity of the light-emitting layer will attenuate as the lighting time increases. Therefore, the light emitting properties of the organic light-emitting device are relatively poor.

Figures 1, 2:
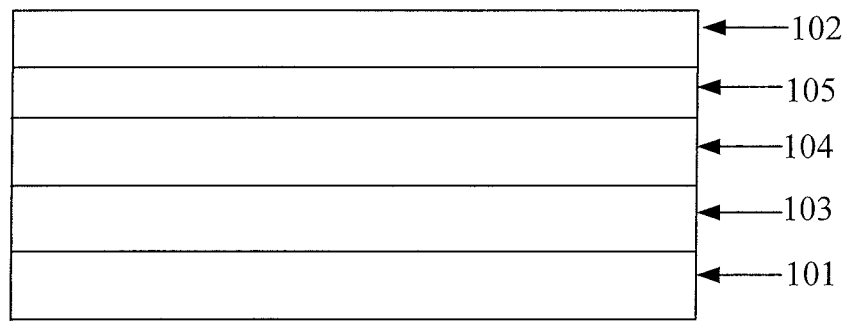
Figure 2:
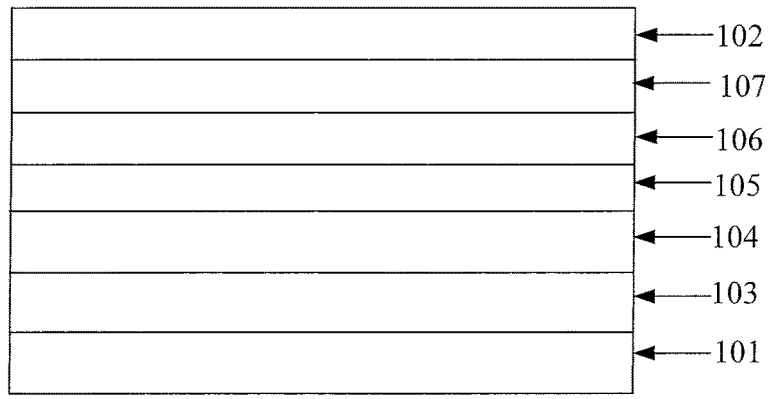

An embodiment of this disclosure provides an organic light-emitting device 100. As shown in FIG. 2-1, this organic light-emitting device 100 comprises:

a first electrode 101;

a second electrode 102;

a first light-emitting layer 103 provided between the first electrode 101 and the second electrode 102;

a spacing layer 104 provided between the first light-emitting layer 103 and the second electrode 102;

a light intensity compensation layer 105 provided between the spacing layer 104 and the second electrode 102, wherein the color of light emitted from the light intensity compensation layer 105 is the same as that of the first light-emitting layer 103, and when a recombination area of electrons and holes in the first light-emitting layer 103 moves, the light intensity compensation layer 105 limits the recombination area in the light intensity compensation layer 105 and compensates the light intensity of the first light-emitting layer 103.

In summary, with respect to the organic light-emitting device provided in an embodiment of this disclosure, this organic light-emitting device comprises a spacing layer provided between the first light-emitting layer and the second electrode and a light intensity compensation layer provided between the spacing layer and the second electrode, wherein the color of light emitted from the light intensity compensation layer is the same as that of the first light-emitting layer, and when a recombination area of electrons and holes in the first light-emitting layer moves, the light intensity compensation layer limits the recombination area in the light intensity compensation layer and compensates the light intensity of the first light-emitting layer. Therefore, the light-emitting properties of the organic light-emitting device are improved.

Optionally, the light intensity compensation layer 105 and the first light-emitting layer 103 in FIG. 2-1 may be both blue light-emitting layers. When a recombination area of electrons and holes in the first light-emitting layer moves, the light intensity compensation layer limits the recombination area in the light intensity compensation layer and compensates the light intensity of the first light-emitting layer. In this way, the blue light emitted from the first light-emitting layer can be compensated by the light intensity compensation layer as the lighting time increases, so as to solve the problem of relatively poor light-emitting properties of organic light-emitting devices.

Further, as shown in FIG. 2-2, this organic light-emitting device 100 further comprises:

a charge generation layer 106 provided between the light intensity compensation layer 105 and the second electrode 102; and a second light-emitting layer 107 provided between the charge generation layer 106 and the second electrode 102.

Here, the charge generation layer 106 is used to generate electrons and holes under the condition of an externally applied electric field. With respect to the charge generation layer, the prior art can be referred to, and verbose words are omitted in embodiments of this disclosure.

In FIG. 2-2, 101 is a first electrode, 103 is a first light-emitting layer, and 104 is a spacing layer. The light intensity compensation layer 105 and the first light-emitting layer 103 may be both blue light-emitting layers, and the second light-emitting layer 107 may be a yellow light-emitting layer. In the prior art, the light intensity of the blue light-emitting layer of the organic light-emitting device attenuates faster compared to the light intensity of the yellow light-emitting layer as the lighting time increases, leading to the occurrence of color cast of white light emitted from the organic light-emitting device. Whereas the light intensity compensation layer contained in the organic light-emitting device in FIG. 2-2 limits the recombination area in the light intensity compensation layer and compensates the light intensity of the blue light-emitting layer when the recombination area of electrons and holes in the first light-emitting layer moves, so that the occurrence of color cast of white light emitted from the organic light-emitting device is avoided and light emitting properties of the organic light-emitting device are improved.

Figures 2, 3:
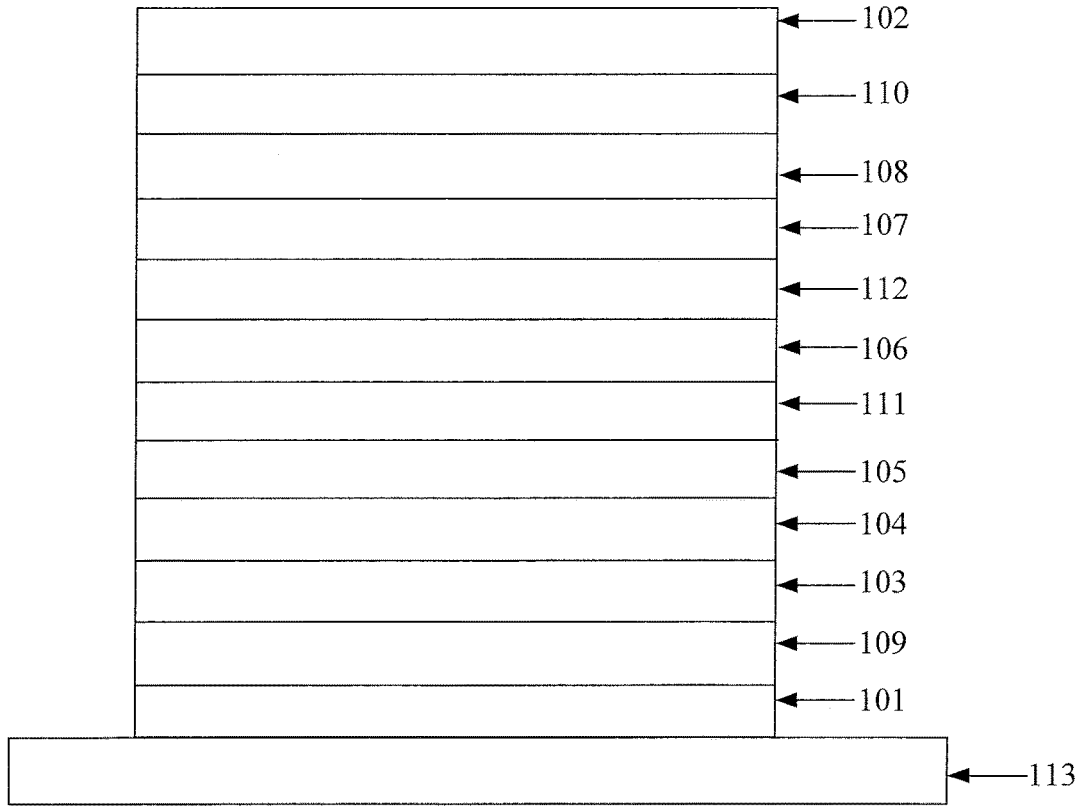

FIG. 2-3 shows a structural schematic diagram of another organic light-emitting device 100. As shown in FIG. 2-3, this organic light-emitting device comprises:

a first electrode 101;

a second electrode 102;

a first light-emitting layer 103 provided between the first electrode 101 and the second electrode 102;

a spacing layer 104 provided between the first light-emitting layer 103 and the second electrode 102;

a light intensity compensation layer 105 provided between the spacing layer 104 and the second electrode 102, wherein the color of light emitted from the light intensity compensation layer 105 is the same as that of the first light-emitting layer 103, and when a recombination area of electrons and holes in the first light-emitting layer 103 moves, the light intensity compensation layer 105 limits the recombination area in the light intensity compensation layer 105 and compensates the light intensity of the first light-emitting layer 103;

a charge generation layer 106 provided between the light intensity compensation layer 105 and the second electrode 102;

a second light-emitting layer 107 provided between the charge generation layer 106 and the second electrode 102; and a third light-emitting layer 108 provided between the second light-emitting layer 107 and the second electrode 102.

Further, as shown in FIG. 2-3, this organic light-emitting device 100 may further comprises:

a first hole transport layer 109 provided between the first electrode 101 and the first light-emitting layer 103; and a first electron transport layer 110 provided between the light intensity compensation layer 105 and the second electrode 102.

Further, as shown in FIG. 2-3, this organic light-emitting device 100 may further comprises:

a second electron transport layer 111 provided between the light intensity compensation layer 105 and the charge generation layer 106; and a second hole transport layer 112 provided between the charge generation layer 106 and the second light-emitting layer 107.

Here, the first hole transport layer 109 and the second hole transport layer 112 are used to adjust the injection speed and the injection amount of holes in the light-emitting layer, and the first electron transport layer 110 and the second electron transport layer 111 are used to adjust the injection speed and the injection amount of electrons in the light-emitting layer. With respect to the first hole transport layer, the first electron transport layer, the second electron transport layer, and the second hole transport layer, the prior art can be referred to, and verbose words are omitted in embodiments of this disclosure.

Furthermore, 113 in FIG. 2-3 is a substrate, and the substrate is a transparent substrate. This substrate may be produced from one or a combination of several of glass, quartz, plastic, transparent metal thin sheets.

The first electrode 101 is an anode, and this anode is a transparent electrode layer. Preferably, the anode may be an indium tin oxide (simply referred to as ITO) layer or an indium zinc oxide (simply referred to as IZO) layer.

The first hole transport layer 109 and the second hole transport layer 112 may be produced from the same material, or may be produced from different materials. The first hole transport layer 109 and the second hole transport layer 112 may be produced from a p-type semiconductor material. The first hole transport layer 109 and the second hole transport layer 112 may be produced from an arylamine compound. This is not limited in the embodiments of this disclosure.

In FIG. 2-3, the light intensity compensation layer 105 and the first light-emitting layer 103 may be both blue light-emitting layers, the second light-emitting layer 107 may be a red light-emitting layer, and the third light-emitting layer 108 may be a green light-emitting layer. In the prior art, the light intensity of the blue light-emitting layer of the organic light-emitting device attenuates faster compared to the light intensity of the red light-emitting layer and the light intensity of the green light-emitting layer as the lighting time increases, leading to the occurrence of color cast of white light emitted from the organic light-emitting device. Whereas the light intensity compensation layer contained in the organic light-emitting device in FIG. 2-3 limits the recombination area in the light intensity compensation layer and compensates the light intensity of the blue light-emitting layer when the recombination area of electrons and holes in the first light-emitting layer moves, so that the occurrence of color cast of white light emitted from the organic light-emitting device is avoided and light emitting properties of the organic light-emitting device are improved.

The first light-emitting layer may be composed of one or more materials selected from N-arylbenzimidazoles; 1,2,4-triazole derivatives (TAZ); 1,3,4-oxadiazole derivatives OXD-(P-NMe$_2$); distyrylarylenes; and BPVBi.

Here, the light intensity compensation layer 105 in FIG. 2-1 has a host-guest doping structure. The light intensity compensation layer comprises a host material and a guest dopant, the guest dopant is doped in the host material, the host material is an n-type organic semiconductor material, and the guest dopant is a light-emitting material. The host material is selected from one or more of aromatic compounds having a large conjugate plane such as N-arylbenzimidazoles; 1,2,4-triazole derivatives (TAZ); 1,3,4-oxadiazole derivatives OXD-(P-NMe$_2$); and distyrylarylenes. The guest dopant is mainly selected from metal complex light-emitting materials and the metal complex light-emitting material is formed by the coordination of a metal ion and a ligand, wherein Be$^{2+}$, Zn$^{2+}$, Al$^{3+}$, Ca$^{2+}$, In$^{3+}$, Tb$^{3+}$, Eu$^{3+}$, or Gd$^{3+}$ may be used as the metal ion, and 8-hydroxyquinolines, 10-hydroxybenzoquinolines, Schiff bases, hydroxybenzothiazoles (oxazoles), and hydroxyflavonoids may be used as the ligand. Exemplarily, the doping concentration of the guest dopant in the light intensity compensation layer may be 1 wt % to 10 wt % based on the total weight of the light intensity compensation layer. When the light intensity compensation layer and the first light-emitting layer are both blue light-emitting layers, the guest dopant is a blue light-emitting material. This light intensity compensation layer has a host-guest doping structure and improves the light emitting properties of the light intensity compensation layer.

Further, the highest occupied molecular orbital (simply referred to as HOMO) energy level of the host material of the light intensity compensation layer is lower than or equal to the HOMO energy level of the spacing layer, and the lowest unoccupied molecular orbital (simply referred to as LUMO) energy level of the host material is equal to the LUMO energy level of the spacing layer. In this way, the electron mobility in the host material is relatively fast, so that the recombination area (i.e., a recombination area of excitons formed after electrons and holes are combined) of electrons and holes can be limited not to move any longer. The light intensity compensation layer limits this recombination area in the light intensity compensation layer to facilitate recombination and light emission of the excitons in the light intensity compensation layer. Here, HOMO refers to the molecule orbital having the highest energy among the molecule orbitals occupied by electrons. LUMO refers to the molecule orbital having the lowest energy among the molecule orbitals not occupied by electrons. Exemplarily, the thickness of the host material is 5 nm (nanometers) to 10 nm.

When the HOMO energy level of the host material of the light intensity compensation layer is lower than the HOMO energy level of the spacing layer, the HOMO energy level difference between the host material and the spacing layer may be optionally 0.1 eV to 0.3 eV. Optionally, the HOMO energy level difference between the host material and the spacing layer may be 0.1 eV (electron volts). That is, the HOMO energy level of the host material is lower than the HOMO energy level of the spacing layer by 0.1 eV.

Further, the spacing layer 104 in FIG. 2-1 is produced from an n-type organic semiconductor material, and the HOMO energy level of the spacing layer is lower than the HOMO energy level of the first light-emitting layer. The n-type organic semiconductor material from which the spacing layer is produced is selected from one or more of aromatic compounds having a large conjugate plane, aluminum 8-hydroxyquinolinate (Alq$_3$) metal complexes, oxadiazole compounds, imidazole compounds, perfluorated materials, and organoboron and organosilicon materials. Exemplarily, the HOMO energy level difference between the spacing layer and the first light-emitting layer may be 0.1 eV to 0.5 eV. That is, the HOMO energy level of the spacing layer is lower than the HOMO energy level of the first light-emitting layer by 0.1 eV to 0.5 eV. The LUMO energy level of the spacing layer is higher than the LUMO energy level of the first light-emitting layer. Exemplarily, the LUMO energy level difference between the spacing layer and the first light-emitting layer may be 0.1 eV to 0.3 eV. That is, the LUMO energy level of the spacing layer is higher than the LUMO energy level of the first light-emitting layer by 0.1 eV to 0.3 eV. This spacing layer enables that excitons can be preferably recombined in the first light-emitting layer to emit light when the organic light-emitting device just begins to be lighted. Exemplarily, the thickness of the spacing layer may be 2 nm (nanometers) to 3 nm.

As illustrated by exemplifying the organic light-emitting device shown in FIG. 2-1, the light intensity compensation layer 105 and the first light-emitting layer 103 are both blue light-emitting layers. When a forward voltage is externally applied, excitons are preferably recombined in the first light-emitting layer 103 to emit blue light under the action of the spacing layer 104. As the lighting time increases, the recombination area of electrons and holes in the first light-emitting layer 103 moves towards the second electrode 102, wherein the thickness of the spacing layer 104 between the first light-emitting layer 103 and the light intensity compensation layer 105 is 2 nm to 3 nm, and a part of excitons are recombined in the light intensity compensation layer 105 to emit blue light. At the meanwhile, the electron mobility of the host material in the light intensity compensation layer 105 is relatively fast so that the recombination area does not continue to move towards the second electrode 102 any longer but is limited in the light intensity compensation layer 105, and therefore the light intensity of the blue light of the first light-emitting layer 103 is allowed to be compensated by the light intensity compensation layer 105. Since the light intensity compensation layer can compensate the light intensity of the first light-emitting layer and in turn allows that the white light emitted from the organic light-emitting device will not be subjected to the occurrence of color cast (color cast means that the white light emitted from the organic light-emitting device becomes yellow light) as the lighting time increases, the problem of color cast in the prior art is improved and the overall white light balance is ensured.

As illustrated by exemplifying the organic light-emitting device shown in FIG. 2-3, the light intensity compensation layer 105 and the first light-emitting layer 103 are both blue light-emitting layers, the second light-emitting layer 107 is a red light-emitting layer, and the third light-emitting layer 108 is a green light-emitting layer. When a forward voltage is externally applied, the spacing layer 104 has the function of blocking holes from the first electrode 101, and electrons from the charge generation layer 106 and holes from the first electrode 101 are firstly combined in the first light-emitting layer 103 to form excitons under the action of the spacing layer 104. These excitons are recombined in the first light-emitting layer 103 to emit blue light. At the meanwhile, electrons from the second electrode 102 and holes from the charge generation layer 106 are combined in the second light-emitting layer 107 to form excitons and these excitons are recombined in the second light-emitting layer 107 to emit red light, electrons from the second electrode 102 and holes from the charge generation layer 106 are combined in the third light-emitting layer 108 to form excitons and these excitons are recombined in the third light-emitting layer 108 to emit green light. At this time, white light may be seen on the outside of a substrate 113. As the lighting time increases, the recombination area of electrons and holes in the first light-emitting layer 103 moves towards the second electrode 102, i.e., towards the light intensity compensation layer 105, wherein the thickness of the spacing layer 104 is 2 nm to 3 nm, and a part of excitons are recombined in the light intensity compensation layer 105 to emit blue light. At the meanwhile, the electron mobility of the host material in the light intensity compensation layer 105 is relatively fast so that the recombination area does not continue to move towards the second electrode 102 any longer but is limited in the light intensity compensation layer 105, and therefore the light intensity of the blue light of the first light-emitting layer 103 is allowed to be compensated by the light intensity compensation layer 105. Since the light intensity compensation layer can compensate the light intensity of the first light-emitting layer and in turn allows that the white light emitted from the organic light-emitting device will not be subjected to the occurrence of color cast (color cast means that the white light emitted from the organic light-emitting device becomes yellow light) as the lighting time increases, the problem of color cast in the prior art is improved and the overall white light balance is ensured. Specific processes in which excitons are recombined in the second light-emitting layer to emit red light and excitons are recombined in the third light-emitting layer to emit green light can be referred to the prior art, and verbose words are omitted in embodiments of this disclosure.

In summary, with respect to the organic light-emitting device provided in an embodiment of this disclosure, this organic light-emitting device comprises a spacing layer provided between the first light-emitting layer and the second electrode and a light intensity compensation layer provided between the spacing layer and the second electrode, wherein the color of light emitted from the light intensity compensation layer is the same as that of the first light-emitting layer, and the light intensity compensation layer is used to limit a recombination area in the light intensity compensation layer and compensate the light intensity of the first light-emitting layer when the recombination area of electrons and holes in the first light-emitting layer moves. Therefore, the light-emitting property of the organic light-emitting device is improved, the problem of color cast of monochromatic light (such as blue light) and the problem of color cast of white light are improved, and the organic light-emitting device has a simple structure and will be easily achieved.

An embodiment of this disclosure provides a production method of an organic light-emitting device. As shown in FIG. 3-1, this method comprises the steps of:

Step 301: forming a first light-emitting layer on a first electrode.

As shown in FIG. 3-2, a first light-emitting layer 103 is formed on the first electrode 101.

Step 302: forming a spacing layer on the first light-emitting layer.

As shown in FIG. 3-3, a spacing layer 104 is formed on the first light-emitting layer 103, 101 in FIG. 3-3 is a first electrode.

Step 303: forming a light intensity compensation layer on the spacing layer.

Figures 1, 3:
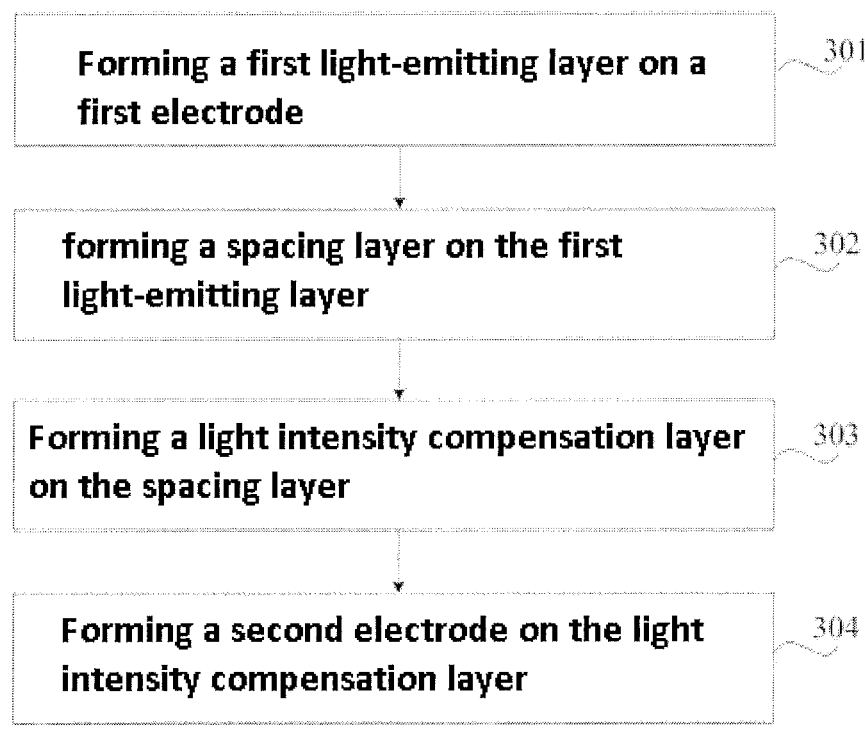
Figures 2, 3:
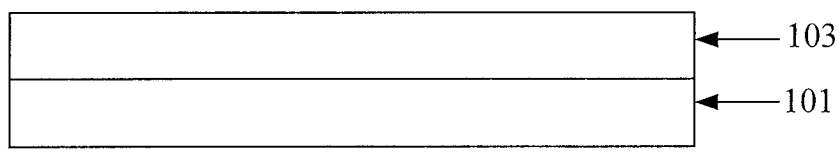
Figure 3:
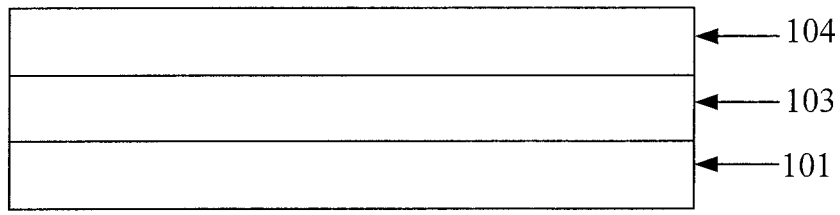
Figures 3, 4:
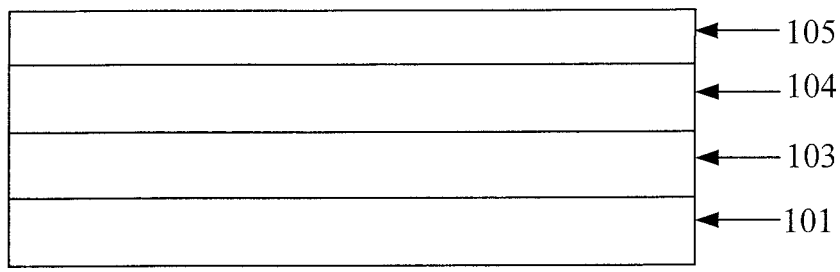

As shown in FIG. 3-4, a light intensity compensation layer 105 is formed on the spacing layer 104, wherein the color of light emitted from the light intensity compensation layer is the same as that of the first light-emitting layer, the light intensity compensation layer is used to limit a recombination area in the light intensity compensation layer and compensate the light intensity of the first light-emitting layer when the recombination area of electrons and holes in the first light-emitting layer move. In FIG. 3-4, 101 is a first electrode, and 103 is a first light-emitting layer.

Step 304: forming a second electrode on the light intensity compensation layer.

As shown in FIG. 2-1, a second electrode 102 is formed on the light intensity compensation layer 105. Optionally, the light intensity compensation layer 105 and the first light-emitting layer 103 in FIG. 2-1 may be both blue light-emitting layers. Therefore, this method allows that blue light emitted from the first light-emitting layer can be compensated by the light intensity compensation layer, so as to solve the problem of relatively poor light-emitting properties of organic light-emitting devices.

In summary, with respect to the production method of an organic light-emitting device provided in an embodiment of this disclosure, it is possible to form a spacing layer on a first light-emitting layer and form a light intensity compensation layer on the spacing layer by this method, wherein the color of light emitted from the light intensity compensation layer is the same as that of the first light-emitting layer, and the light intensity compensation layer is used to limit a recombination area in the light intensity compensation layer and compensate the light intensity of the first light-emitting layer when the recombination area of electrons and holes in the first light-emitting layer moves. Therefore, light-emitting properties of the organic light-emitting device are improved.

Optionally, Step 304 may comprise: forming a charge generation layer, a second light-emitting layer, and the second electrode, in this order, on the light intensity compensation layer. Particularly, as shown in FIG. 2-2, a charge generation layer 106 is formed on the light intensity compensation layer 105, a second light-emitting layer 107 is formed on the charge generation layer 106, and a second electrode 102 is formed on the second light-emitting layer 107. Optionally, in FIG. 2-2, the light intensity compensation layer 105 and the first light-emitting layer 103 may be both blue light-emitting layers, and the second light-emitting layer 107 may be a yellow light-emitting layer. The light intensity compensation layer formed by this method limits the recombination area in the light intensity compensation layer and compensates the light intensity of the blue light-emitting layer when the recombination area of electrons and holes in the first light-emitting layer moves, so that the occurrence of color cast of white light emitted from the organic light-emitting device is avoided and the light emitting properties of the organic light-emitting device are improved.

Figures 3, 4, 5:
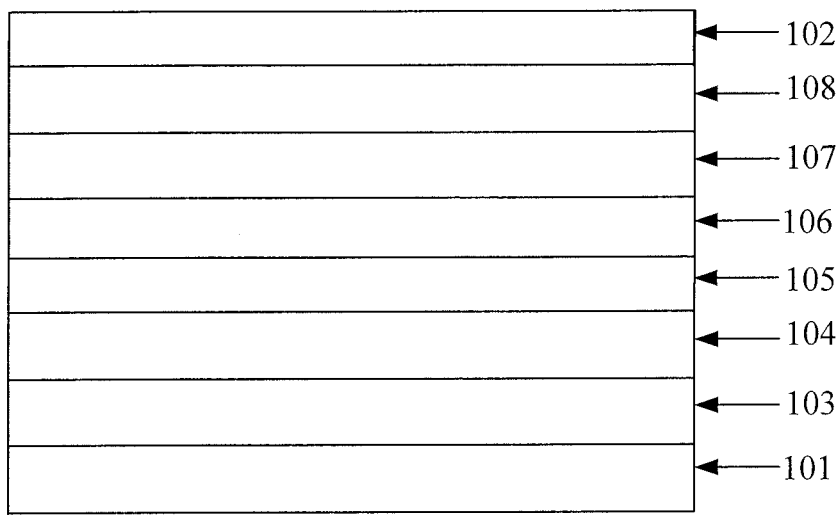

Optionally, Step 304 may also comprise: forming a charge generation layer, a second light-emitting layer, a third light-emitting layer, and a second electrode, in this order, on the light intensity compensation layer. Particularly, as shown in FIG. 3-5, a charge generation layer 106 is formed on the light intensity compensation layer 105, a second light-emitting layer 107 is formed on the charge generation layer 106, a third light-emitting layer 108 is formed on the second light-emitting layer 107, and a second electrode 102 is formed on the third light-emitting layer 108. Optionally, in FIG. 2-2, the light intensity compensation layer 105 and the first light-emitting layer 103 may be both blue light-emitting layers, the second light-emitting layer 107 may be a red light-emitting layer, and the third light-emitting layer 108 may be a green light-emitting layer. The light intensity compensation layer formed by this method limits the recombination area in the light intensity compensation layer and compensates the light intensity of the blue light-emitting layer when the recombination area of electrons and holes in the first light-emitting layer moves, so that the occurrence of color cast of white light emitted from the organic light-emitting device is avoided, the light emitting properties of the organic light-emitting device are improved, and the overall white light balance is ensured. The meanings of other reference numerals in FIG. 3-5 can be referred to FIG. 3-4.

Further, with reference to FIG. 2-3, forming a first light-emitting layer on the first electrode comprises: forming a first hole transport layer 109 and a first light-emitting layer 103, in this order, on the first electrode 101. Here, the first hole transport layer 109 is used to adjust the injection speed and the injection amount of holes in the light-emitting layer.

Furthermore, forming a second electrode on the light intensity compensation layer may comprise: forming a first electron transport layer and a second electrode, in this order, on the light intensity compensation layer. Here, the first electron transport layer is used to adjust the injection speed and the injection amount of electrons in the light-emitting layer.

Optionally, Step 304 may further comprise: forming a second electron transport layer, a charge generation layer, a second hole transport layer, a second light-emitting layer, a third light-emitting layer, a first electron transport layer, and a second electrode, in this order, on the light intensity compensation layer.

In summary, with respect to the production method of an organic light-emitting device provided in an embodiment of this disclosure, it is possible to form a spacing layer on a first light-emitting layer and form a light intensity compensation layer on the spacing layer by this method, wherein the color of light emitted from the light intensity compensation layer is the same as that of the first light-emitting layer, and the light intensity compensation layer is used to limit a recombination area in the light intensity compensation layer and compensate the light intensity of the first light-emitting layer when the recombination area of electrons and holes in the first light-emitting layer moves. Therefore, the light-emitting properties of the organic light-emitting device are improved, the problem of color cast of monochromatic light (such as blue light) and the problem of color cast of white light are improved, and the process of production is simple and will be easily achieved.

An embodiment of this disclosure further provides a display apparatus, comprising the organic light-emitting device as shown in FIG. 2-1, FIG. 2-2, FIG. 2-3, or FIG. 3-5.

In summary, with respect to the organic light-emitting device provided in an embodiment of this disclosure, this organic light-emitting device comprises a spacing layer provided between the first light-emitting layer and the second electrode and a light intensity compensation layer provided between the spacing layer and the second electrode, wherein the color of light emitted from the light intensity compensation layer is the same as that of the first light-emitting layer, and the light intensity compensation layer is used to limit a recombination area in the light intensity compensation layer and compensate the light intensity of the first light-emitting layer when the recombination area of electrons and holes in the first light-emitting layer moves. Therefore, the light-emitting properties of the organic light-emitting device are improved, the problem of color cast of monochromatic light (such as blue light) and the problem of color cast of white light are improved, and the organic light-emitting device has a simple structure and will be easily achieved.

Those described above are merely preferred embodiments of this disclosure, and are not intended to limit this invention. All of modifications, equivalent replacements, improvements, and the like, which are within the spirit and the principle of this invention, should be encompassed in the scope protected by this invention.

What is claimed is:

1. An organic light-emitting device, comprising:
   a first electrode;
   a second electrode;
   a first light-emitting layer provided between the first electrode and the second electrode;
   a spacing layer provided between the first light-emitting layer and the second electrode; and
   a light intensity compensation layer provided between the spacing layer and the second electrode, wherein the color of light emitted from the light intensity compensation layer is the same as that of the first light-emitting layer, and when a recombination area of electrons and holes in the first light-emitting layer moves, the light intensity compensation layer limits the recombination area in the light intensity compensation layer and compensates the light intensity of the first light-emitting layer,
   wherein the light intensity compensation layer comprises a host material and a guest dopant, the guest dopant is doped in the host material, the host material is an n-type organic semiconductor material, and the guest dopant is a light-emitting material.

2. The organic light-emitting device according to claim 1, wherein the organic light-emitting device further comprises:
   a charge generation layer provided between the light intensity compensation layer and the second electrode; and
   a second light-emitting layer provided between the charge generation layer and the second electrode.

3. The organic light-emitting device according to claim 2, wherein the organic light-emitting device further comprises:
   a third light-emitting layer provided between the second light-emitting layer and the second electrode.

4. The organic light-emitting device according to claim 1, wherein the host material is selected from one or more of N-arylbenzimidazoles, 1,2,4-triazole derivatives, 1,3,4-oxadiazole derivatives, and distyrylarylenes; and the guest dopant is a metal complex light-emitting material.

5. The organic light-emitting device according to claim 1, wherein
the highest occupied molecular orbital (HOMO) energy level of the host material is lower than or equal to the HOMO energy level of the spacing layer, and the lowest unoccupied molecular orbital (LUMO) energy level of the host material is equal to the LUMO energy level of the spacing layer.

6. The organic light-emitting device according to claim 5, wherein
the HOMO energy level difference between the host material and the spacing layer is 0.1 eV to 0.3 eV.

7. The organic light-emitting device according to claim 1, wherein
the doping concentration of the guest dopant in the light intensity compensation layer is 1 wt % to 10 wt % based on the total weight of the light intensity compensation layer.

8. The organic light-emitting device according to claim 1, wherein
the light intensity compensation layer has a thickness of 5 nm to 10 nm.

9. The organic light-emitting device according to claim 1, wherein
the spacing layer is produced from an n-type organic semiconductor material, the highest occupied molecular orbital (HOMO) energy level of the spacing layer is lower than the HOMO energy level of the first light-emitting layer, and the lowest unoccupied molecular orbital (LUMO) energy level of the spacing layer is higher than the LUMO energy level of the first light-emitting layer.

10. The organic light-emitting device according to claim 9, wherein
the HOMO energy level difference between the spacing layer and the first light-emitting layer is 0.1 eV to 0.5 eV; and
the LUMO energy level difference between the spacing layer and the first light-emitting layer is 0.1 eV to 0.3 eV.

11. The organic light-emitting device according to claim 1, wherein
the spacing layer has a thickness of 2 nm to 3 nm.

12. The organic light-emitting device according to claim 3, wherein
the light intensity compensation layer and the first light-emitting layer are both blue light-emitting layers;
the second light-emitting layer is a red light-emitting layer; and
the third light-emitting layer is a green light-emitting layer.

13. The organic light-emitting device according to claim 1, wherein the organic light-emitting device further comprises:
a first hole transport layer provided between the first electrode and the first light-emitting layer; and
a first electron transport layer provided between the light intensity compensation layer and the second electrode.

14. A production method of an organic light-emitting device, comprising the steps of:
forming a first light-emitting layer on a first electrode;
forming a spacing layer on the first light-emitting layer;
forming a light intensity compensation layer on the spacing layer; and
forming a second electrode on the light intensity compensation layer;
wherein the color of light emitted from the light intensity compensation layer is the same as that of the first light-emitting layer, and when a recombination area of electrons and holes in the first light-emitting layer moves, the light intensity compensation layer limits the recombination area in the light intensity compensation layer and compensates the light intensity of the first light-emitting layer,
wherein the light intensity compensation layer comprises a host material and a guest dopant, the guest dopant is doped in the host material, the host material is an n-type organic semiconductor material, and the guest dopant is a light-emitting material.

15. The method according to claim 14, wherein said forming a second electrode on the light intensity compensation layer comprises:
forming a charge generation layer, a second light-emitting layer, and the second electrode, in this order, on the light intensity compensation layer.

16. The method according to claim 15, wherein said forming a second electrode on the light intensity compensation layer comprises:
forming the charge generation layer, the second light-emitting layer, a third light-emitting layer, and the second electrode, in this order, on the light intensity compensation layer.

17. The method according to claim 16, wherein
the light intensity compensation layer and the first light-emitting layer are both blue light-emitting layers;
the second light-emitting layer is a red light-emitting layer; and
the third light-emitting layer is a green light-emitting layer.

18. The method according to claim 14, wherein
said forming a first light-emitting layer on a first electrode comprises:
forming a first hole transport layer and the first light-emitting layer, in this order, on the first electrode; and
said forming a second electrode on the light intensity compensation layer comprises:
forming a first electron transport layer and the second electrode, in this order, on the light intensity compensation layer.

19. A display apparatus, comprising the organic light-emitting device of claim 1.

* * * * *